United States Patent [19]
Adams, Jr. et al.

[11] Patent Number: 5,303,122
[45] Date of Patent: Apr. 12, 1994

[54] PRINTED CIRCUIT BOARD HAVING A COMMONIZED MOUNTING PAD WHICH DIFFERENT SIZED SURFACE MOUNTED DEVICES CAN BE MOUNTED

[75] Inventors: Clifford G. Adams, Jr., Rochester Hills, Mich.; Donald P. Beaudoin, Toronto, Canada; Arturo Ruiz-Miramontes, Chihuahua, Mexico

[73] Assignee: Ford Motor Company, Dearborn, Mich.

[21] Appl. No.: 64,722

[22] Filed: May 19, 1993

Related U.S. Application Data

[63] Continuation of Ser. No. 785,718, Oct. 31, 1991, abandoned.

[51] Int. Cl.$^5$ .............................................. H05K 7/02
[52] U.S. Cl. .................................... 361/767; 174/261; 174/263; 228/180.21; 228/180.22; 257/778; 361/760; 361/808; 439/68; 439/83
[58] Field of Search ................ 29/832, 836, 842, 843; 174/250, 253, 260, 261, 263; 228/180.21, 180.22; 257/723, 724, 777, 778; 361/760, 767, 768, 772, 777, 779, 807, 808; 439/68, 71, 83, 72, 876

[56] References Cited

U.S. PATENT DOCUMENTS

| | | | |
|---|---|---|---|
| 4,130,722 | 12/1978 | Levijoki | 174/260 |
| 4,509,096 | 4/1985 | Baldwin et al. | 361/403 |
| 4,605,987 | 8/1986 | Allensworth | 361/406 |
| 4,645,114 | 2/1987 | Van Den Brekel et al. | 228/180.21 |
| 4,870,225 | 9/1989 | Anao et al. | 361/406 |

FOREIGN PATENT DOCUMENTS 2732529  1/1978  Fed. Rep. of Germany ...... 361/406

OTHER PUBLICATIONS

IBM Technical Disclosure Bulletin "Electrode Pattern" by Milliken et al. vol. 11, No. 7, Dec. 1968.
IBM Technical Disclosure Bulletin "Flip-Chip Joining Physical Land Restriction" by R. H. Massey vol. 12, No. 1, Jun. 1969.

*Primary Examiner*—Leo P. Picard
*Assistant Examiner*—Donald A. Sparks
*Attorney, Agent, or Firm*—Mark Mollon; Roger L. May

[57] ABSTRACT

The present invention provides a printed circuit board having a unique commonized pad upon which different sized surface mounted devices can be mounted. The preferred form of the commonized pad comprises two electrically conductive pads, each having a tapered portion that electrically connects a narrow portion to a wide portion. The present invention is advantageous over known pads in that it (1) allows for using different sizes of surface mounted devices without redesign and (2) it does not require wasting what might otherwise be antiquated inventory or continuation of an old process to use up what would be antiquated inventory.

7 Claims, 2 Drawing Sheets

5,303,122

PRINTED CIRCUIT BOARD HAVING A COMMONIZED MOUNTING PAD WHICH DIFFERENT SIZED SURFACE MOUNTED DEVICES CAN BE MOUNTED

This application is a continuation of application Ser. No. 07/785,718, filed Oct. 31, 1991 now abandoned.

FIELD OF THE INVENTION

This invention relates to a printed circuit board having at least one pad on which a surface mounted device can be mounted. More particularly, this invention relates to a printed circuit board having at least one commonized pad upon which a plurality of different sized surface mounted devices can be mounted.

BACKGROUND OF THE INVENTION

Most electronic devices are now packaged with their electronic components mounted on printed circuit boards ("PCB"). PCBs have electrically conductive leads that are often connected to electrically conductive pads upon which surface mounted devices ("SMDs") can be mounted. Typically, these SMDs are resistors or capacitors. However, SMDs can also be inductors, "jumpers" (which short circuit two points), or other electrical components known to those of ordinary skill in the art. Generally, the electrical element of an SMD is carried within a ceramic or plastic package having two conductive end portions (connected internally through the electrical element) and a nonconductive center portion. To permanently connect the SMD electrically to the PCB, its conductive end portions are soldered to appropriately spaced conductive pads provided on the surface of the PCB.

Problems can arise, if known conductive pads are used, when one attempts to change the size of an SMD; for example, due to design requirements or the desire to substitute one SMD for another. For instance, it may be desired to change from the use of a large SMD (e.g., a 1206 SMD) to a small SMD (e.g., an 0805 SMD). Originally, for a large SMD, the conductive pads of the PCB would have to be larger than some minimum size in order to properly solder the conductive end portions of the SMD to the pads. However, if production changes to use a small SMD, problems arise due to the conductive pads being too big and spaced too far apart for the smaller SMD. This may result in excess solder being deposited to connect the first conductive pad of the PCB to the first conductive end portion of the small SMD and the second conductive pad to the second conductive end portion. Quite often there will be enough excess solder to bridge the gap between the conductive pads, shorting them together. If this happens, the SMD's component (i.e., resistor, capacitor, inductor, etc.) is shorted and cannot perform its intended function. Those of ordinary skill in the art will appreciate that even if the SMD is to merely serve as a jumper, a problem may arise, because excess solder could short together two electrically conductive paths that were not intended to be shorted together.

A manufacturer may use the original, large SMDs, despite a desire to substitute a smaller SMD, or may redesign the PCB with smaller more closely spaced conductive pads to better accommodate the small SMDs. The first choice simply forgoes an opportunity to substitute the smaller chip. The second choice, in addition to requiring potentially costly redesign of the PCB layout, renders any large SMD inventory a loss if production of the new PCBs redesigned for using the small SMDs starts prior to the total depletion of the large SMD inventory.

SUMMARY OF THE INVENTION

According to the present invention, PCBs are provided with at least one commonized pad adapted to be connected to two or more different size SMDs. The commonized pad allows one to switch SMD size without redesign of the PCB. A further advantage of the commonized pad is that a change in SMD size would not require a production line change or a continuation of an "old" process until the "antiquated" SMD and PCB inventory has been depleted. From the summary, drawings, and descriptions below, it will be readily understood by those of ordinary skill in the art how the commonized pad of the invention provides various advantages and constitutes a significant advance in the art.

In its preferred form, the commonized pad has first and second electrically conductive pads which are spaced apart from each other. Each electrically conductive pad has a wide portion, a narrow portion, and a tapered portion connecting the wide and narrow portions. The narrow portions of the first and second electrically conductive pads are separated by a nonconductive portion of the surface of the PCB. The commonized pad can be used with different size SMDs. If a small SMD is used, the conductive end portions of the SMD cover a portion, typically at least the majority, of the narrow portions of each electrically conductive pad. This leaves a part of each narrow portion, each tapered portion, and each wide portion of the electrically conductive pads exposed. On the other hand, if a large SMD is used, its conductive ends portions typically will cover the narrow portions and the tapered portions. This leaves only the wide portions exposed.

Accordingly, the preferred form of the present invention is advantageous over prior devices in that it (1) allows for using different sizes of SMDs without redesign and (2) it does not require wasting what would otherwise be antiquated inventory or continuation of an old process to use up what would otherwise be antiquated inventory. These and additional features and advantages of the invention will be further understood from the following detailed description of preferred embodiments.

BRIEF DESCRIPTION OF THE DRAWINGS

The present invention is shown for purposes of illustration, but not of limitation, in the accompanying drawings in which like numbers refer to like parts throughout and in which.

DETAILED DESCRIPTION OF PREFERRED EMBODIMENTS

The present invention provides a unique PCB with a commonized pad which allows different sized SMDs to be soldered to the PCB without problems previously experienced in the art. Accordingly, the present invention is advantageous over known pads in that it (1) allows for using different sizes of SMDs without redesign and (2) it does not require wasting what might otherwise be antiquated inventory or continuation of an old process to use up such inventory.

The following description details the structure of a PCB having a single commonized pad on one surface thereof and the physical relationship between the commonized pad and both a large and small SMD mounted thereon. However, it will be apparent to those of ordinary skill in the art in view of the present disclosure, that a PCB may have numerous commonized pads in accordance with the invention on each side of it, depending upon the design of the circuit.

Figure 1:
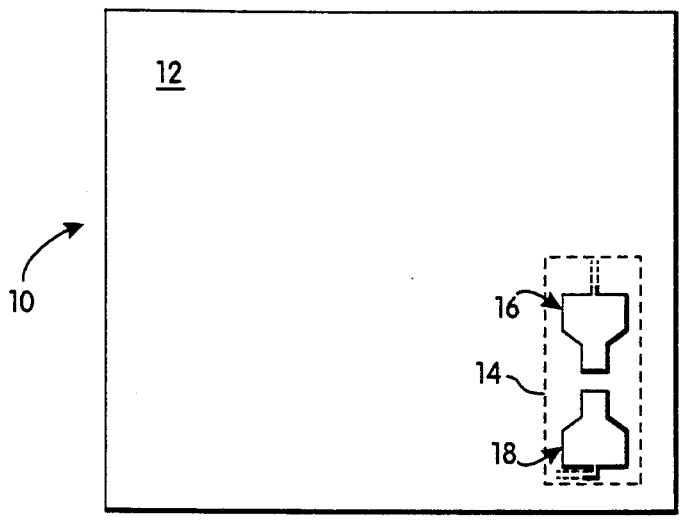
FIG. 1 is a top view of a PCB with a commonized pad of preferred form.

Referring to FIG. 1, a PCB 10 has a surface 12 with commonized pad 14. The commonized pad is comprised of a first electrically conductive pad 16 and a second electrically conductive pad 18.

Figure 2:
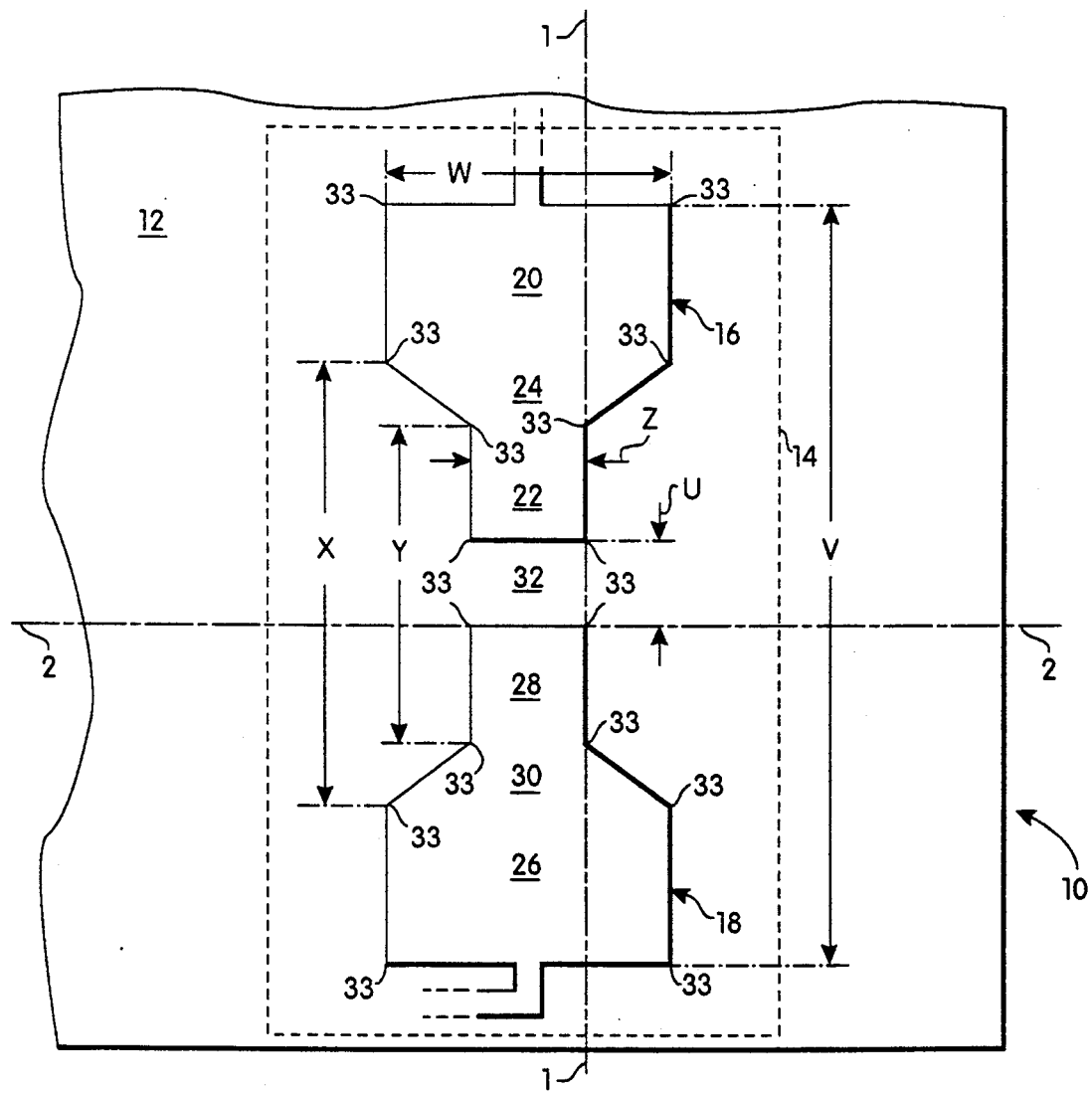
FIG. 2 is an enlarged view of a portion of the PCB of FIG. 1.

Referring to FIG. 2, the first electrically conductive pad 16 is comprised of a wide portion 20, a narrow portion 22, and a tapered portion 24. The tapered portion 24 is interposed between and electrically connects the wide portion 20 and the narrow portion 22. Likewise, the second electrically conductive pad 18 is comprised of a wide portion 26, a narrow portion 28, and a tapered portion 30. The tapered portion 30 is interposed between and electrically connects the wide portion 26 and the narrow portion 28. The narrow portion 22 of the first electrically conductive pad 16 is separated from the narrow portion 28 of the second electrically conductive pad 18 by a nonconductive portion 32 on the surface 12 of the PCB 10. Those of ordinary skill in the art will understand that if the SMD 34 functions as a jumper, the nonconductive portion 32 on the surface 12 of the PCB 10 may in some cases have a separate conductive portion of the PCB circuit (not shown) running therethrough. Lastly, the corners 33 of the commonized pad 14 should, in the preferred form, have very small radii of curvature, preferably less than 0.5 millimeters.

Again referring to FIG. 2, the dimensions of the commonized pad 14, where "length" refers to the distance taken along line 1—1 and "width" refers to the distance taken along line 2—2, are defined as follows: (1) "U" is the length of the nonconductive portion 32; (2) "V" is total length of the commonized pad 14; (3) "W" is the width of the wide portions, 20 and 26, of the commonized pad 14; (4) "X" is the length of the tapered portions, 24 and 30, plus the length of the narrow portions, 22 and 28, plus the length of the nonconductive portion 32; (5) "Y" is the length of the narrow portions, 22 and 28, plus the length of the nonconductive portion 32; and (6) "Z" is the width of the narrow portions, 22 and 28.

After defining variables used to describe the dimensions of the SMDs, the above variables will be defined in relation to the SMD variables in terms of both preferred and allowable dimensions. Unless otherwise stated, all numerical values are in millimeters.

Figure 3:
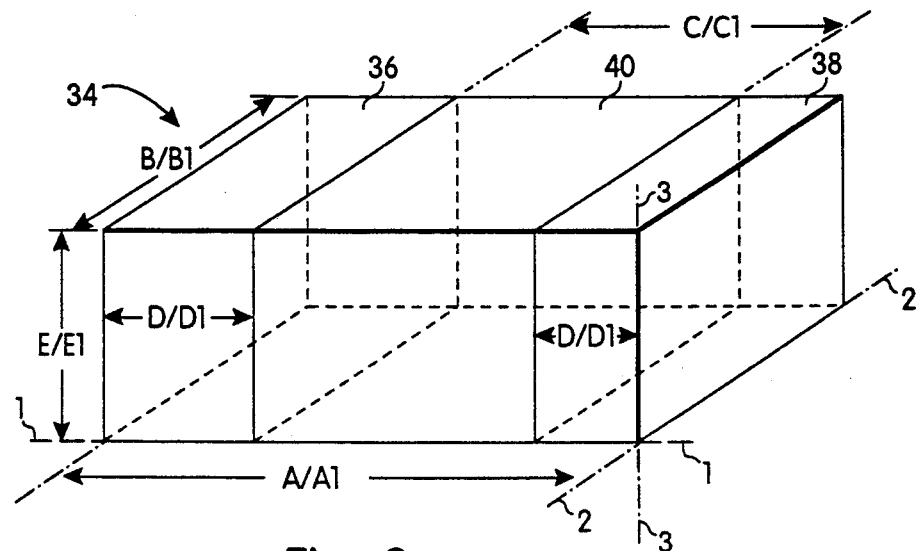
FIG. 3 is a perspective view of an SMD.

Referring to FIG. 3, an SMD 34 is shown. The SMD 34 has a first conductive end portion 36, a second conductive end portion 38, and a nonconductive center portion 40 between the two conductive portions. Once positioned upon the PCB 10, the first conductive end portion 36 is soldered to the first electrically conductive pad 16 and the second conductive end portion 38 is soldered to the second electrically conductive pad 18. Once soldered to the PCB 10, the SMD 34 acts as a particular electrical component (i.e., resistor, capacitor, etc.) depending upon the internal structure of the SMD. Familiarity with the internal structure of an SMD is not necessary to understanding the invention. Given that the commonized pad 14 is adapted to receive an SMD 34 of either of two different sizes, letters A, B, C, D, and E will be used to describe the larger sized SMDs and letters A1, B1, C1, D1, and E1 will be used to describe the smaller sized SMDs.

Again referring to FIG. 3, "length" refers to the distance taken along line 1—1, "width" refers to the distance taken along line 2—2, and height refers to the distance taken along line 3—3 of the SMD 34. These SMD dimensions are defined as follows: (1) "A" is the length of the large SMD 34; (2) "B" is the width of the large SMD 34; (3) "C" is the length of the nonconductive center portion 40 of the large SMD 34; (4) "D" is the length of both the first conductive end portion 36 and the second conductive end portion 38 of the large SMD 34; and (5) "E" is the height of the large SMD 34. Similarly, (1) "A1" is the length of the small SMD 34; "B1" is the width of the small SMD 34; (3) "C1" is the length of the nonconductive center portion 40 of the small SMD 34; (4) "D1" is the length of both the first conductive end portion 36 and the second conductive end portion 38 of the small SMD 34; and (5) "E1" is the height of the small SMD 34.

Referring to FIGS. 2 and 3, having defined the dimension for both the large and the small sized SMD 34 and the commonized pad 14, it is useful to provide general equations governing the relationship between the two sets of variables. Note that "max" and "min" designations will be used where "max(x)" refers to the maximum value of the variable "x" and "min(x)" refers to the minimum value of the variable "x" within manufacturing tolerances of the SMD 34. The allowable commonized pad 14 dimensions are as follows:

(1) U is greater than min(C1) and less than or equal to max(C1);
(2) V is greater than max(A);
(3) W is greater than or equal to min(B);
(4) X is less than V and greater than or equal to min(C);
(5) Y is less than X and greater than or equal to min(A1); and
(6) Z is greater than or equal to min(B1).

The preferred commonized pad 14 dimensions are as follows:

(1) U equals max(A1) minus two times max(D1);
(2) V equals max(A) plus two times (max(E) plus 0.5);
(3) W equals max(B) minus 0.2;
(4) X equals min(A) plus 0.2;
(5) Y equals max(A1) plus 0.2; and
(6) Z equals max(B1) minus 0.15.

Again referring to FIGS. 2 and 3, the dimensions of the SMD 34 and the commonized pad 14 have been described, in general terms, with respect to each other. Table I, below, represents an illustrative example applying the above equations to a commonized pad 14 adapted to be used with both an 0805 small SMD 34 and a 1206 large SMD 34. All dimensions are in millimeters. The dimensions of both the 0805 and 1206 SMDs are well know in the art.

TABLE I

|    | Actual    | Allowable | Preferred |
|----|-----------|-----------|-----------|
| A1 | 2.0+/−.2  | —         | —         |
| B1 | 1.25+/−.2 | —         | —         |

TABLE I-continued

|  | Actual | Allowable | Preferred |
|---|---|---|---|
| C1 | 0.8 to 1.94 | — | — |
| D1,D | 0.13 to 0.5 | — | — |
| E1 | 0.45+/−.1 | — | — |
| A | 3.2+/−.2 | — | — |
| B | 1.6+/−.2 | — | — |
| C | 2.0 to 3.14 | — | — |
| E | 0.6+/−.1 | — | — |
| U | — | 0.8 to 1.94 | 1.2 |
| V | — | 3.4+ | 5.8 |
| W | — | 1.4+ | 1.6 |
| X | — | 2.0 to V | 3.2 |
| Y | — | 1.8 to X | 2.4 |
| Z | — | 1.05+ | 1.3 |

An experiment was conducted using the 0805 small SMD 34 and the 1206 large SMD 34. Tests were conducted with the 0805 small SMD 34 on both a typical 0805 pad and the commonized pad 14 described in Table I, above. Tests were also conducted with the 1206 large SMD 34 on both a typical 1206 pad and the commonized pad 14. The tests were done with wave soldering (as opposed to IR, for example). A glue dot was placed on the circuit board to retain the chips for soldering. Table II, below, summarizes the results of the experiment. In Table II, "PPM" stands for "parts per million." The "total points" row refers to the total number of times that a one of the conductive end portions, 36 or 38, of the specified SMD 34 was soldered to the specified pad. The "shorts PPM" row refers to the number of times the conductive end portions, 36 and 38, were shorted together during the soldering process (calculated for one million SMDs soldered). The "misposition PPM" row refers to the number of times the SMD 34 was skewed either due to misplacement on the PCB 10 or defective soldering (calculated for one million attempts). The "excess solder PPM" refers to the number of times the solder joint holding a conductive end portion, 36 or 38, to the commonized pad 14 had excess solder (calculated for one million solder joints). The "solder skips PPM" refers to the number of times that no solder was placed to join a conductive end portion, 36 or 38, to the commonized pad 14 (calculated for one million solder joints). It should be noted that the data obtained in this experiment has high PPM levels due to the super critical clearance conditions used on the PCBs (done to induce failure) and the limited opportunity to adjust, or improve, the soldering processes (due to the total number of PCBs being tested). It should also be noted that this experiment was done as an initial test of the operability of the commonized pad design of the invention. Operability is clearly demonstrated. Actual "factory floor" production conditions, however, must be expected to yield results which potentially are significantly different, depending on factors such as process control measures and the like.

TABLE II

|  | 0805 on 0805 pad | 0805 on common pad | 1206 on 1206 pad | 1206 on common pad |
|---|---|---|---|---|
| Total points: | 10816 | 7020 | 9360 | 12220 |
| Shorts PPM: | 6195 | 427 | 26389 | 33879 |
| Mis-poistion PPM: | 4346 | 2277 | 2671 | 491 |
| Excess Solder PPM: | 1757 | 4554 | 1603 | 0 |
| Solder Skips PPM: | 0 | 0 | 0 | 0 |

It can be seen from Table II that the commonized pad of the invention performs quite well.

Figure 4:
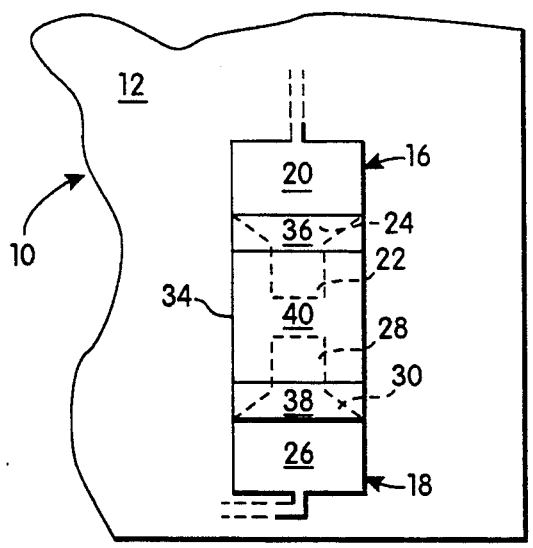
FIG. 4 is a top view of a larger SMD mounted upon the commonized pad of the PCB of FIG. 1.

Referring now to FIG. 4, a large SMD 34 is shown mounted upon a commonized pad 14. At the first conductive end portion 36, SMD 34 covers the narrow portion 22 and the tapered portion 24 of the first electrically conductive pad 16 and at the second conductive end portion 38 it covers the narrow portion 28 and the tapered portion 30 of the second electrically conductive pad 18. The large SMD 34 preferably does not cover any substantial portion of either of the wide portions, 20 or 26. This is ensured by the equation "X equals min(A) plus 0.2" as stated above (see FIGS. 2 and 3 and accompanying description), which takes the manufacturing tolerance of the SMD 34 into account.

Figure 5:
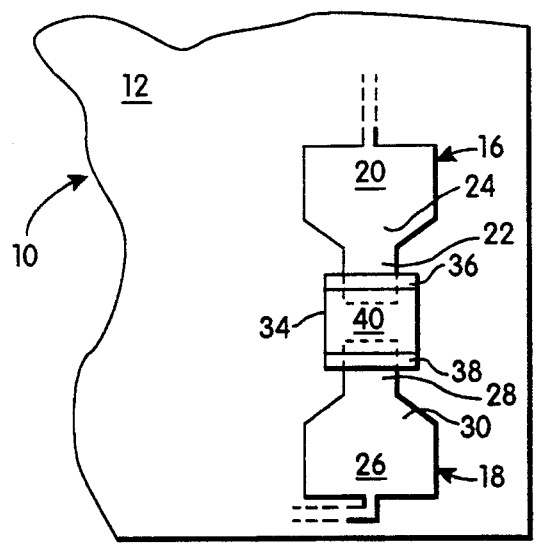
FIG. 5 is a top view of a smaller SMD mounted upon the commonized pad of the PCB of FIG. 1.

Referring now to FIG. 5, a small SMD 34 is shown mounted upon a commonized pad 14. At the first conductive end portion 36, SMD 34 covers a majority of the narrow portion 22 of the first electrically conductive pad 16 and at the second conductive end portion 38 it covers the majority of the narrow portion 28 of the second electrically conductive pad 18. The small SMD 34 does not cover any portion of the either of the wide portions, 20 or 26, or any portion of either of the tapered portions, 24 or 30. This is ensured by the equation "Y equals max(A1) plus 0.2" as stated above (see FIGS. 2 and 3 and accompanying description), which takes the manufacturing tolerance of the SMD 34 into account.

Generalizing FIGS. 4 and 5 in addition to the above description pertinent thereto, it is clear that, in the preferred form of the invention, the narrow portion 22 and the tapered portion 24 of the first electrically conductive pad 16 and the narrow portion 28 and the tapered portion 30 of the second electrically conductive pad 18 comprise a means for receiving the large surface mounted device. Further, it is also clear that part of, preferably the majority of, the narrow portion 22 of the first electrically conductive pad 16 and part of, preferably the majority of, the narrow portion 28 of the second electrically conductive pad 18 comprise a means for receiving the small surface mounted device. However, in a non-preferred but acceptable form of the invention (i.e., a form of the invention without the tapered portions, 24 and 30, and where the narrow portions, 22 and 28, are connected directly to the wide portions, 20 and 26, respectively) the narrow portion 22 of the first electrically conductive pad 16 and the narrow portion 28 of the second electrically conductive pad 18 comprise the means for receiving the large surface mounted device. Further, part of, preferably the majority of, the narrow portion 22 of the first electrically conductive pad 16 and part of, preferably the majority of, the narrow portion 28 of the second electrically conductive pad 18 comprise the means for receiving the small surface mounted device. Thus, it is apparent that in the preferred form of the invention, the tapered portions, 24 and 30, electrically connect, or short together, the narrow portion 22 with the wide portion 20 and the narrow portion 28 with the wide portion 26, respectively. In the non-preferred but acceptable form of the invention, the wide portions, 20 and 26, physically contact and are shorted to the narrow portions, 22 and 28, respectively. Alternative less preferred applications of the invention will be apparent to those skilled in the art in view of the present disclosure.

The invention has been described in detail with particular reference to an illustrative preferred embodiment thereof. However, it will be understood that variations and modifications including, for example, but not limited to, the omission of the tapered portions, 24 and 30, can be effected within the spirit and scope of the invention as described hereinabove and as defined in the appended claims.

We claim:

1. A printed circuit board having at least one commonized pad adapted to receive, in the alternative:
   a large surface mounted device having length A, width B, a non-conductive center portion of length C, and first and second conductive end portions of length D; and
   a small surface mounted device having length A1, width B1, a non-conductive center portion of length C1, and first and second conductive end portions of length D1;
the commonized pad having length V and comprising LSMD means for receiving the large surface mounted device and SSMD means for receiving the small surface mounted device, wherein the LSMD means and SSMD means together comprise:
   (a) a first electrically conductive pad having a substantially rectangular wide portion of width W and a substantially rectangular narrow portion of width Z shorted together by a tapered portion of length X and width decreasing from W at the wide portion to Z at the narrow portion; and
   (b) a second electrically conductive pad having a substantially rectangular wide portion of width W and a substantially rectangular narrow portion of width Z shorted together by a tapered portion of length X and width decreasing from W at the wide portion to Z at the narrow portion;
the second electrically conductive pad having a configuration substantially identical to the first electrically conductive pad and being oriented oppositely thereto, the narrow portions being closer to each other than the wide portions are to each other, the narrow portions being separated from each other by a non-conductive portion of length U of the printed circuit board, and Y being the combined length of the narrow portions and the non-conductive portion between them, and wherein:
   (i) U is greater than min(C1) and less than or equal to max(C1);
   (ii) V is greater than max(A);
   (iii) W is greater than or equal to min(B);
   (iv) X is less than V and greater than or equal to min(C);
   (v) Y equals X; and
   (vi) Z is greater than or equal to min(B1); "max" and "min" designating the maximum and minimum value of a dimension within manufacturing tolerances.

2. The printed circuit board of claim 1 wherein a large surface mounted device is mounted upon the commonized pad covering the narrow portion of the first electrically conductive pad and the narrow portion of the second electrically conductive pad.

3. The printed circuit board of claim 1 wherein a small surface mounted device is mounted upon the commonized pad covering only a part of the narrow portion of the first electrically conductive pad and a part of the narrow portion of the second electrically conductive pad.

4. The printed circuit board of claim 1 wherein:
   (i) U equals max(A1) minus two times max(D1);
   (ii) V equals max(A) plus two times (max(E) plus 0.5 mm);
   (iii) W equals max(B) minus 0.2 mm;
   (iv) X equals min(A) plus 0.2 mm;
   (v) Y equals max(A1) plus 0.2 mm; and
   (vi) Z equals max(B1) minus 0.15 mm.

5. The printed circuit board of claim 1 wherein:
   (i) U has a value of 0.8 mm to 1.94 mm;
   (ii) V has a value of greater than 3.4 mm;
   (iii) W has a value of greater than 1.4 mm;
   (iv) X has a value within the range of 2.0 mm to the value of V;
   (v) Y has a value in the range of 1.8 mm to the value of X; and
   (vi) Z has a value greater than 1.05 mm.

6. The printed circuit board of claim 1 wherein:
   (i) U has a value of 1.2 mm;
   (ii) V has a value of 5.8 mm;
   (iii) W has a value of 1.6 m;
   (iv) X has a value of 3.2 mm;
   (v) Y has a value of 2.4 mm;
   (vi) Z has a value of 1.3 mm.

7. A method of mounting a surface mounted device onto a commonized pad of a printed circuit board, the commonized pad being adapted to receive, in the alternative;
   a large surface mounted device having length A, width B, a non-conductive center portion of length C, and first and second conductive end portions of length D; and
   a small surface mounted device having length A1, width B1, a non-conductive center portion of length C1, and first and second conductive end portions of length D1;
the commonized pad having length V and comprising LSMD means for receiving the large surface mounted device and SSMD means for receiving the small surface mounted device, wherein the LSMD means and SSMD means together comprise:
   (a) a first electrically conductive pad having a substantially rectangular wide portion of width W and a substantially rectangular narrow portion of width Z shorted together by a tapered portion of length X and width decreasing from W at the wide portion to Z at the narrow portion; and
   (b) a second electrically conductive pad having a substantially rectangular wide portion of width W and a substantially rectangular narrow portion of width Z shorted together by a tapered portion of length X and width decreasing from W at the wide portion to Z at the narrow portion;
the second electrically conductive pad having a configuration substantially identical to the first electrically conductive pad and being oriented oppositely thereto, the narrow portions being closer to each other than the wide portions are to each other, the narrow portions being separated from each other by a non-conductive portion of length U of the printed circuit board, and Y being the combined length of the narrow portions and the non-conductive portion between them, and wherein:
   (i) U is greater than min(C1) and less than or equal to max(C1);
   (ii) V is greater than max(A);
   (iii) W is greater than or equal to min(B);
   (iv) X is less than V and greater than or equal to min(C);
   (v) Y equals X; and
   (vi) Z is greater than or equal to min(B1); "max" and "min" designating the maximum and minimum value of a dimension within manufacturing tolerances, said methods comprising the steps of:
(a) providing a first electrically conductive pad and a second electrically conductive pad on the printed circuit board, each of the electrically conductive pads having a narrow portion and a wide portion, the narrow portion of the first electrically conductive pad being separated from the narrow portion of the second electrically conductive pad by a nonconductive portion of the printed circuit board and being closer to the narrow portion of the second electrically conductive pad;
(b) providing surface mounted device selected from said large surface mounted device and said small surface mounted device; and
(b) soldering the two conductive end portions of the surface mounted device to at least part of the first and second electrically conductive pads, respectively.

* * * * *